United States Patent
Mao et al.

(10) Patent No.: US 10,964,609 B2
(45) Date of Patent: Mar. 30, 2021

(54) APPARATUS AND METHOD FOR DETECTING END POINT

(71) Applicant: Taiwan Semiconductor Manufacturing Co., Ltd., Hsinchu (TW)

(72) Inventors: Yi-Chao Mao, Taoyuan County (TW); Chin-Chuan Chang, Hsinchu County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/420,186

(22) Filed: May 23, 2019

(65) Prior Publication Data

US 2020/0176337 A1 Jun. 4, 2020

Related U.S. Application Data

(60) Provisional application No. 62/773,186, filed on Nov. 30, 2018.

(51) Int. Cl.
  *H01L 21/56* (2006.01)
  *H01L 21/66* (2006.01)
  *H01L 21/306* (2006.01)

(52) U.S. Cl.
  CPC ........ *H01L 22/26* (2013.01); *H01L 21/30625* (2013.01); *H01L 21/561* (2013.01); *H01L 21/568* (2013.01)

(58) Field of Classification Search
  CPC . H01L 22/26; H01L 21/568; H01L 21/30625; H01L 21/561
  See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2005/0092620 A1* | 5/2005 | Mavliev | C25F 3/02 205/662 |

* cited by examiner

*Primary Examiner* — Matthew L Reames
(74) *Attorney, Agent, or Firm* — JCIPRNET

(57) ABSTRACT

An apparatus for detecting an endpoint of a grinding process includes a connecting device, a timer and a controller. The connecting device is connected to a sensor that periodically senses an interface of a reconstructed wafer comprising a plurality of dies of at least two types to generate a thickness signal comprising thicknesses from a surface of an insulating layer of the reconstructed wafer to the interface of the reconstructed wafer. The timer is configured to generate a clock signal having a plurality of pulses with a time interval. The controller is coupled to the sensor and the timer, and configured to filter the thickness signal according to the clock signal to output a thickness extremum among the thicknesses in the thickness signal within each time interval, wherein the thickness signal after the filtering is used to determine the endpoint of the grinding process being performed on the reconstructed wafer.

20 Claims, 17 Drawing Sheets

APPARATUS AND METHOD FOR DETECTING END POINT

CROSS REFERENCE TO RELATED APPLICATION

This application claims the priority benefit of U.S. provisional application Ser. No. 62/773,186, filed on Nov. 30, 2018. The entirety of the above-mentioned patent application is hereby incorporated by reference herein and made a part of specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

In the manufacturing of the semiconductor devices, a grinding process may be performed to remove portions of molding compound and other dielectric materials on layers of a reconstructed wafer, thereby reducing a thickness of the reconstructed wafer.

Since the layers that are subject to the grinding are often thin layers, accurately stopping the grinding process on the right time is vital to the yield of the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
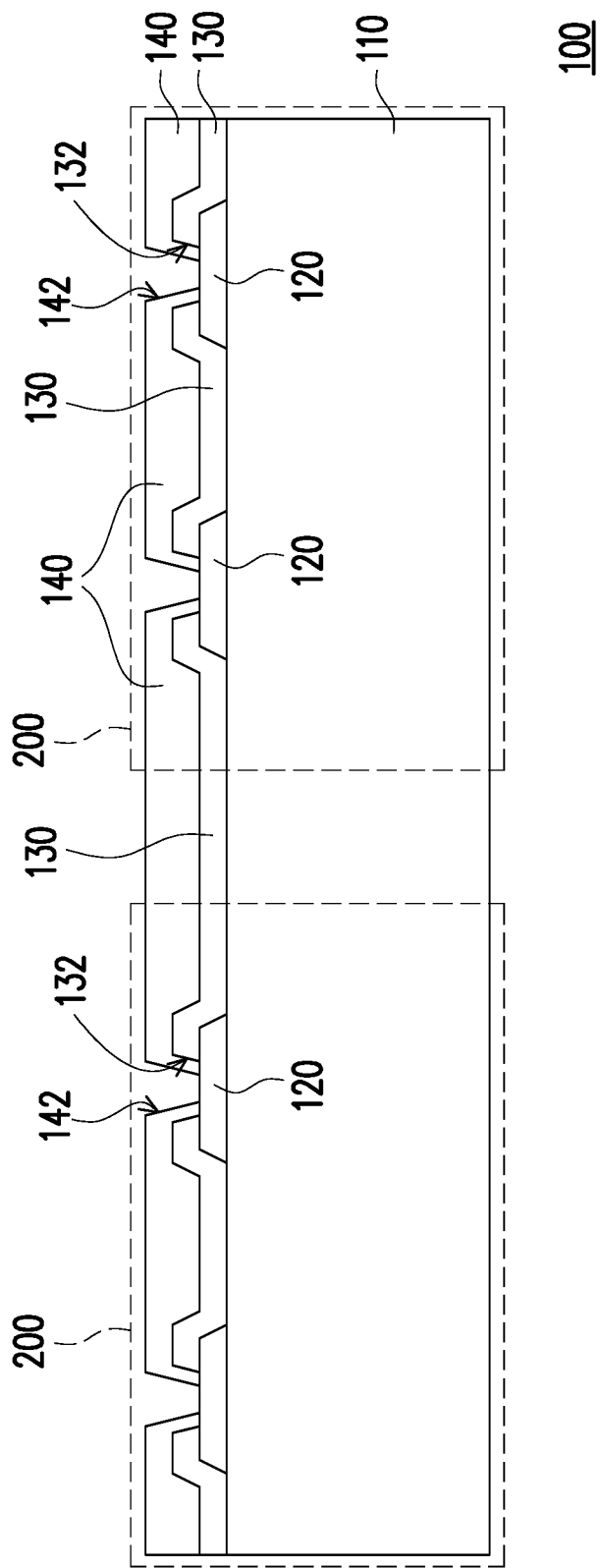
FIG. 1A to FIG. 1G illustrate a process flow for fabricating an integrated fan-out package in accordance with some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G illustrate a process flow for fabricating an integrated fan-out package in accordance with some embodiments of the present disclosure. Referring to FIG. 1A, a wafer 100 including a plurality of semiconductor dies 200 arranged in, for example, an array is provided. Before a wafer dicing process is performed on the wafer 100, the semiconductor dies 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1A, in some embodiments, the wafer 100 may optionally include a post-passivation layer 140 formed over the passivation layer 130. The post-passivation layer 140 covers the passivation layer 130 and has a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 1B:
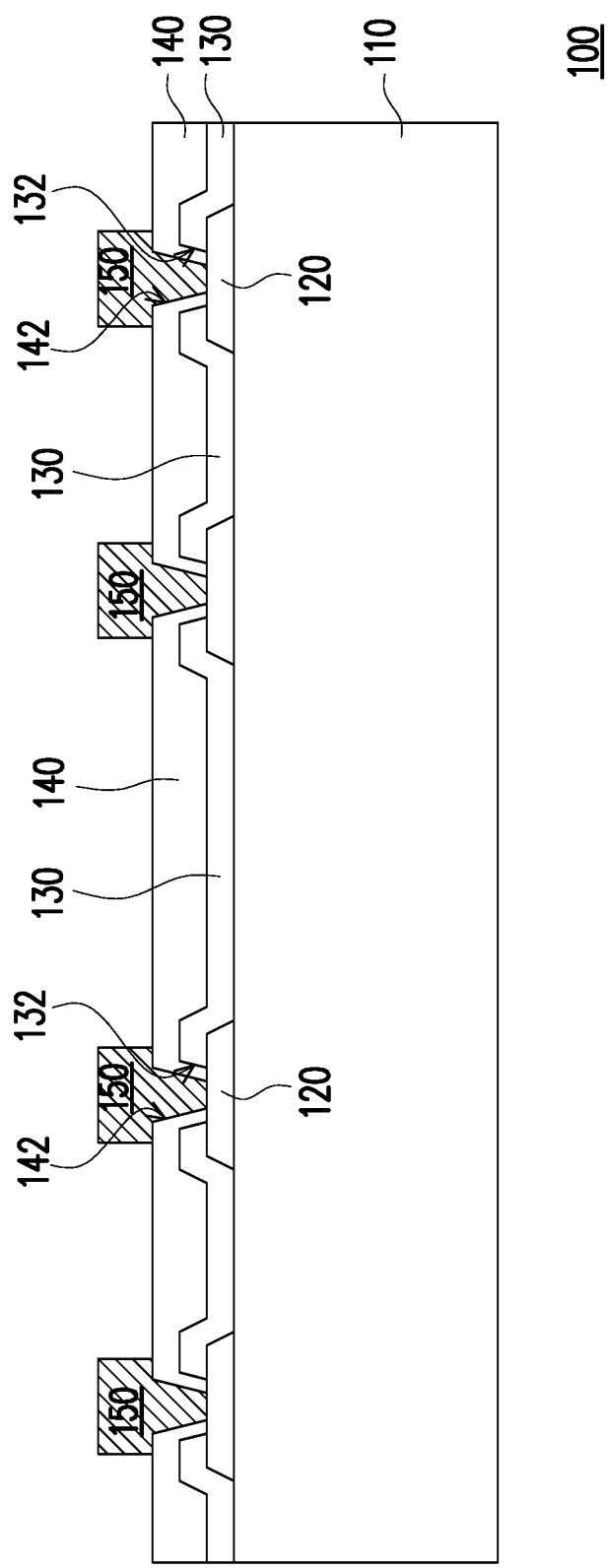

Referring to FIG. 1B, a plurality of conductive pillars 150 are formed on the conductive pads 120. In some embodiments, the conductive pillars 150 are plated on the conductive pads 120. The plating process of conductive pillars 150 is described in detail below. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are corresponding to the conductive pads 120. The wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 may be removed through etching until the post passivation layer 140 is exposed, for example. In some embodiments, the conductive pillars 150 are plated copper pillars.

Figure 1C:
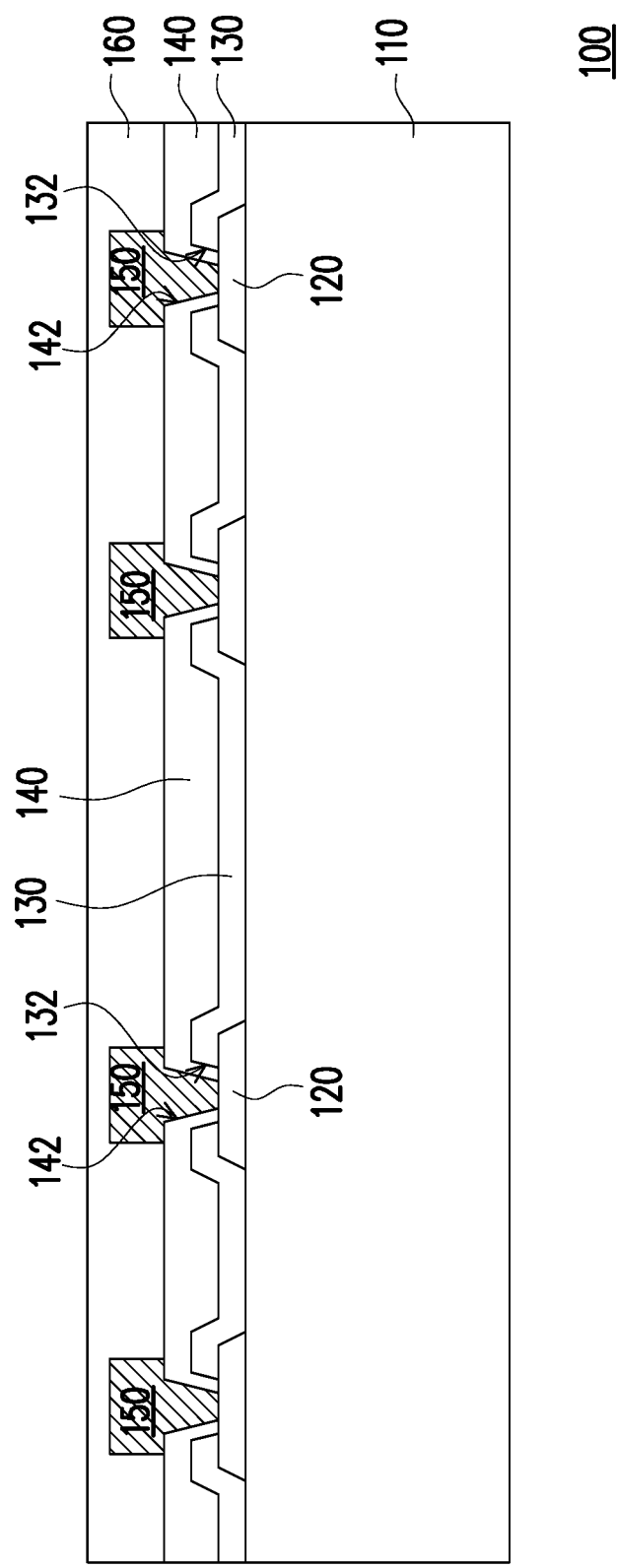

Referring to FIG. 1C, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Figure 1D:
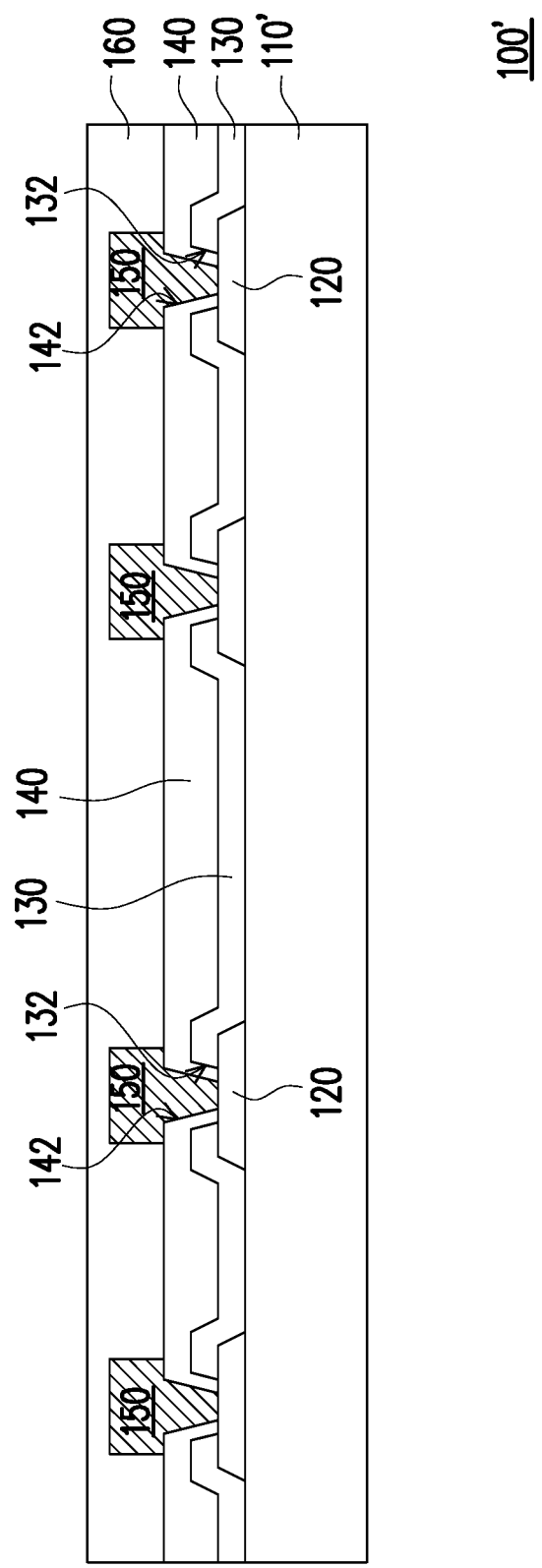

Referring to FIG. 1D, a back side grinding process is performed on the rear surface of the wafer 100 after the protection layer 160 is formed. During the back side grinding process, the semiconductor substrate 110 is ground such that a thinned wafer 100' including a thinned semiconductor substrate 110' is formed.

Figure 1E:
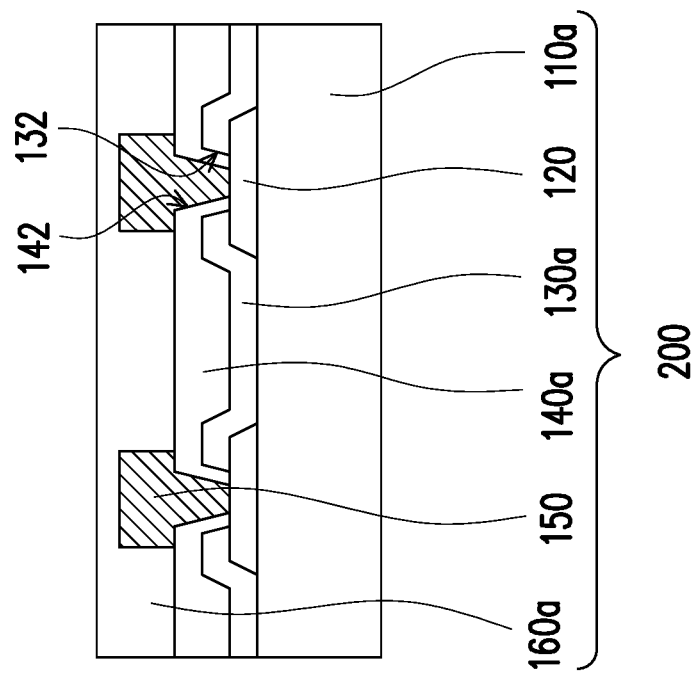
Figure 1E:
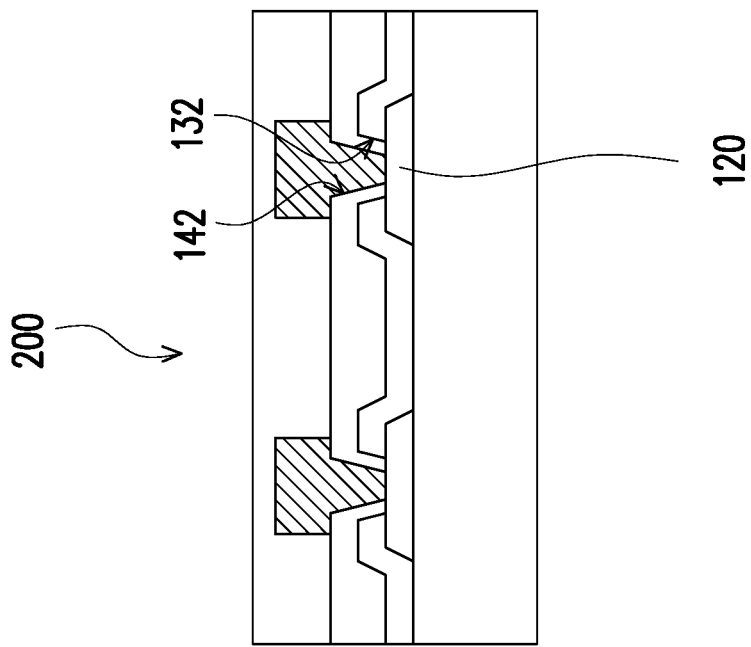

Referring to FIG. 1E, after performing the back side grinding process, a wafer dicing process is performed on the thinned wafer 100' such that the semiconductor dies 200 in the wafer 100' are singulated from one another. Each of the singulated semiconductor dies 200 includes a semiconductor substrate 110a, the conductive pads 120 formed on the semiconductor substrate 110a, a passivation layer 130a, a post passivation layer 140a, the conductive pillars 150, and a protection layer 160a. As shown in FIG. 1D and FIG. 1E, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 1D and FIG. 1E, during the back side grinding and the wafer dicing processes, the protection layer 160 and 160a may protect the conductive pillars 150 of the semiconductor dies 200. In addition, the conductive pillars 150 of the semiconductor dies 200 may be protected from being damaged by sequentially performed processes, such as pick-up and placing process of the semiconductor dies 200, molding process, and so on.

Figure 1F:
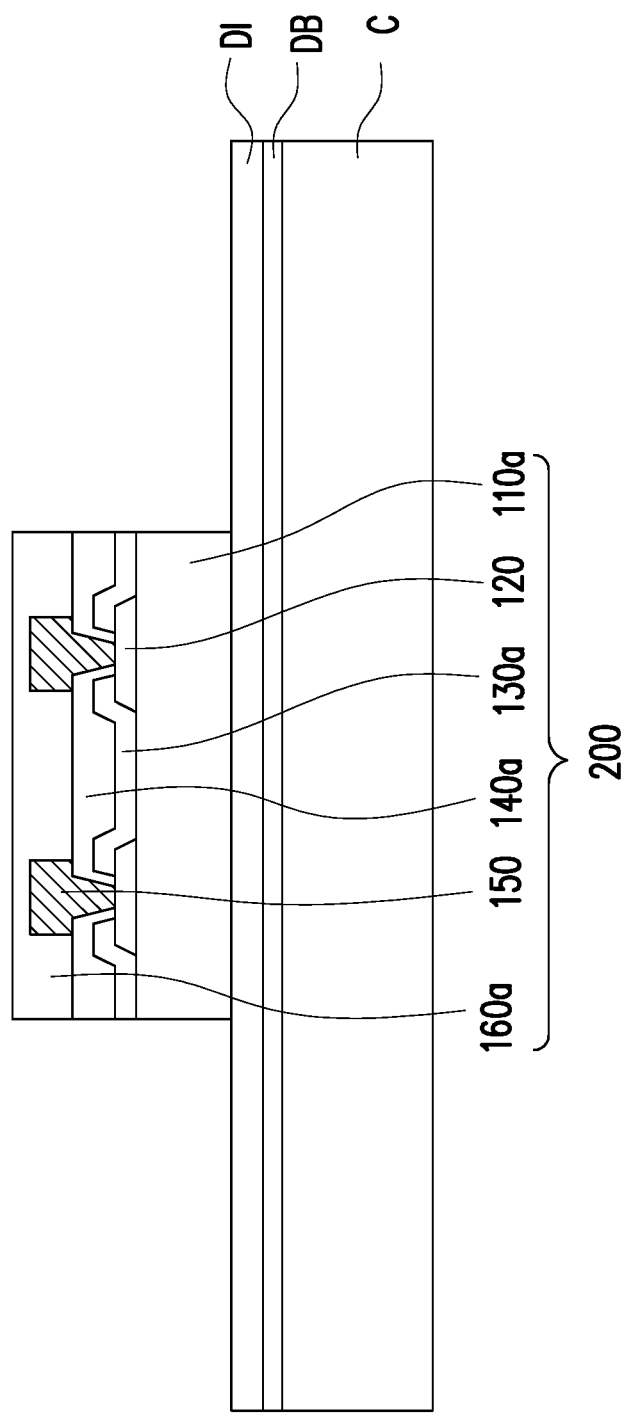

Referring to FIG. 1F, after the semiconductor dies 200 are singulated from the thinned wafer 100' (shown in FIG. 1D), a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

As shown in FIG. 1F, in some embodiments, one of the semiconductor dies 200 including the conductive pads 120, the conductive pillars 150, and a protection layer 160a formed thereon is picked and placed on the dielectric layer DI. The semiconductor die 200 is attached or adhered on the dielectric layer DI through a die attach film (DAF), an adhesion paste or the like. In some alternative embodiments, more than one of the semiconductor dies 200 are picked and placed on the dielectric layer DI, wherein the semiconductor dies 200 placed on the dielectric layer DI may be arranged in an array.

Figure 1G:
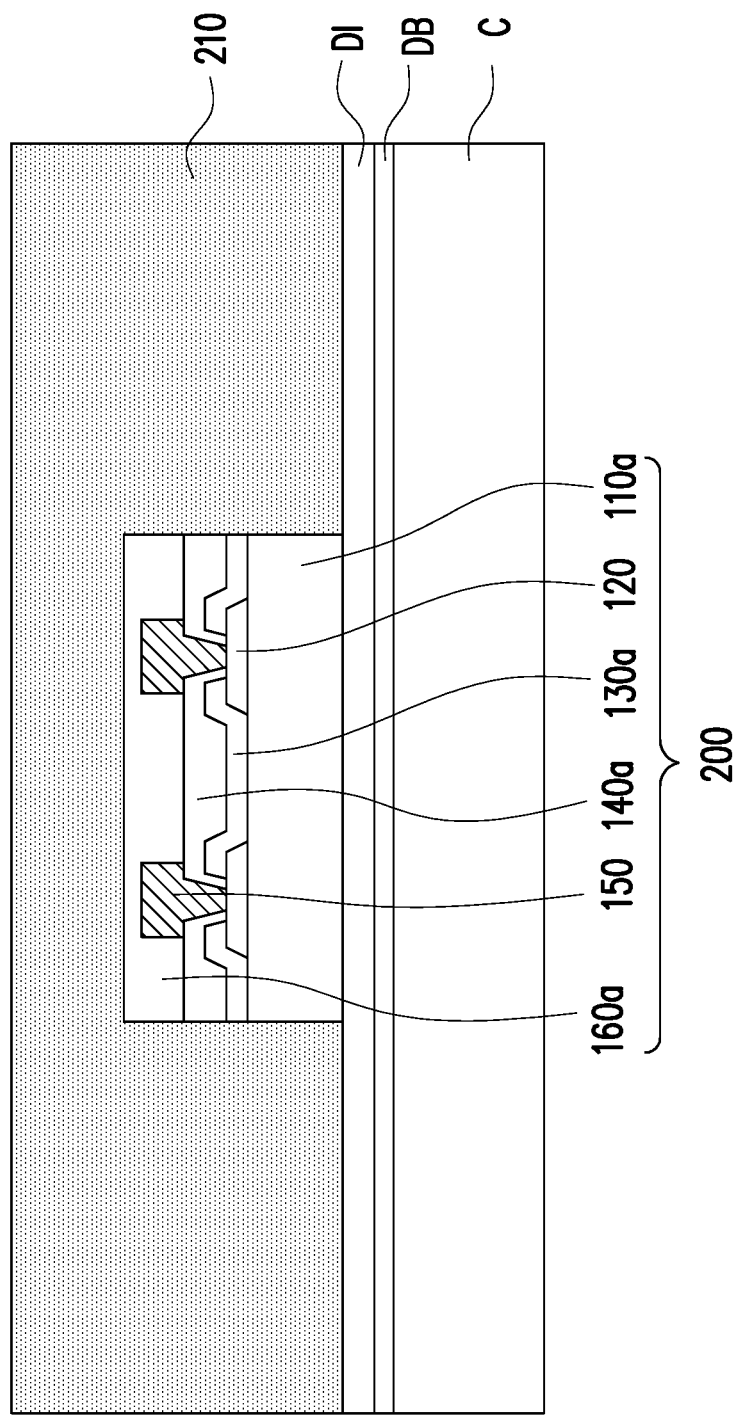

Referring to FIG. 1G, an insulating material 210 is formed on the dielectric layer DI to cover a semiconductor die 200. In some embodiments, the insulating material 210 is a molding compound formed by a molding process. The conductive pillars 150 and the protection layer 160a of the semiconductor die 200 are covered by the insulating material 210. In other words, the conductive pillars 150 and the protection layer 160a of the semiconductor die 200 are not revealed and are well protected by the insulating material 210. In some embodiments, the insulating material 210 includes epoxy or other suitable dielectric materials.

In some alternative embodiments, a plurality of semiconductor dies of at least two types are placed on the dielectric layer DI, where one of the types is same as the type of the semiconductor dies 200 and another one of the types is different from the type of the semiconductor dies 200. The insulating material 210 is formed on the dielectric layer DI to cover the semiconductor dies of the at least two types. In some embodiments, the semiconductor dies of the at least two types are placed on the dielectric layer DI, and the insulating material 210 are formed on the semiconductor dies of the at least two types to generate a reconstructed wafer. The reconstructed wafer may be used in a grinding process, where an endpoint of the grinding process is detected in embodiments of the disclosure.

Figure 1H:
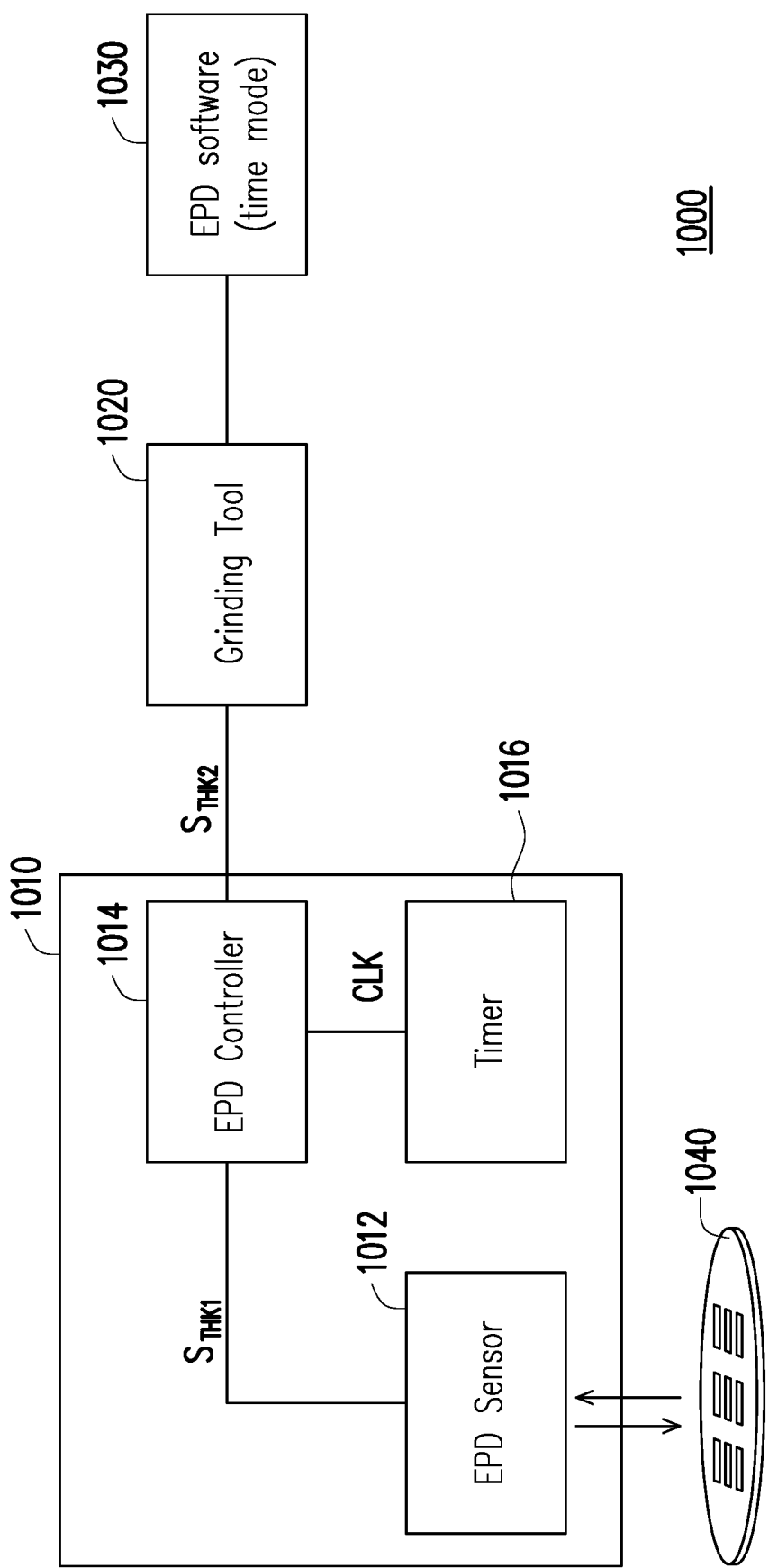
FIG. 1H illustrates a schematic block diagram of an endpoint detection system including an apparatus for detecting an endpoint of a grinding process according to an exemplary embodiment of the disclosure.

In some embodiments, FIG. 1H illustrates a schematic block diagram of an endpoint detection system including an apparatus for detecting an endpoint of a grinding process according to an exemplary embodiment of the disclosure. Referring to FIG. 1H, an endpoint detection system 1000 of the present embodiment may include a detection apparatus 1010 and a grinding tool 1020. The grinding tool 1020 is configured to perform a grinding process on a reconstructed wafer 1040 to remove portions of an insulating layer formed by molding compound and other materials of the reconstructed wafer 1040. In some embodiments, the grinding tool 1020 may include one or more grinding elements (not shown) that are driven to perform the grinding process. The grinding tool 1020 stops the grinding process at an endpoint of the grinding process.

In some embodiments, the detection apparatus 1010 is configured to detect the endpoint of the grinding process of the grinding tool 1040. The detection apparatus 1010 may include an endpoint detection (EPD) sensor 1012, an EPD controller 1014 and a timer 1016. The EPD controller 1014 is connected to the EPD sensor 1012 through a connecting device such as system bus, USB, firewire, thunderbolt, universal asynchronous receiver/transmitter (UART), serial peripheral interface bus (SPI), which is not limited herein. The EPD sensor 1012 is configured to periodically sense an interface of the reconstructed wafer 1040 to generate a thickness signal $S_{THK1}$ in a predetermined period such as 1 microsecond (μs) or a period ranging from 0.1 to 100 μs, which is not limited herein. In some embodiments, the reconstructed wafer 1040 may include a plurality of dies of at least two types and insulating material filled into the space between the dies and above the dies. The insulating material may form an insulating layer of the reconstructed wafer 1040. The thickness signal $S_{THK1}$ sensed by the EPD sensor 1012 indicates thicknesses from a surface of the insulating layer of the reconstructed wafer 1040 to interfaces of the dies. In some embodiments, the thickness signal $S_{THK1}$ may include time-series data of the thicknesses from the surface of the reconstructed wafer's insulating layer to the interfaces of the dies. In other words, the thickness signal $S_{THK1}$ may include a thickness corresponding to each time point of the grinding process.

In some embodiments, the EPD sensor 1012 senses the interface of the reconstructed wafer 1040 according to an optical signal scattered from the surface of the reconstructed wafer 1040. The EPD sensor 1012 may emit an incident optical signal to the reconstructed wafer 1040 and receive reflected optical signals from the reconstructed wafer 1040. The thickness signal is obtained by analyzing characteristics of the incident optical signal and the reflected optical signals, such as time-of-flight of the optical signals, intensity of the reflected optical signal (reflexivity), and the like.

The timer 1016 is configured to generate a clock signal CLK having a plurality of pulses with a time interval. In some embodiments, the timer 1016 may include a clock generator (not shown) for generating the clock signal CLK with a periodic waveform. The time interval may include a pre-determined number of pulses of the clock signal CLK.

In some embodiments, the EPD controller 1014 is coupled to the EPD sensor 1012 and the timer 1016 to receive the thickness signal $S_{THK1}$ from the EPD sensor 1012 and the clock signal CLK from the timer 1016. The EPD sensor 1012 is configured to filter the thickness signal $S_{THK1}$ according to the clock signal CLK to output a filtered thickness signal $S_{THK2}$. Particularly, the EPD sensor 1012 determines a thickness extremum among the thicknesses in the thickness signal $S_{THK1}$ within each time interval. The filtered thickness signal $S_{THK2}$ includes the thickness extrema determined in the time intervals.

In some embodiments, the thickness extremum may be a thickness maximum or a thickness minimum. When the thickness extremum is the thickness maximum, the EPD controller 1014 determine a thickness maximum among the thicknesses of the thickness signal $S_{THK1}$ within each time interval, and output the determined thickness maximum to the grinding tool 1020 through the filtered thickness signal $S_{THK2}$. Alternatively, when the thickness extremum is a thickness minimum, the EPD controller 1014 determine a thickness minimum among the thickness of the thickness signal $S_{THK1}$ within each time interval, and output the determined thickness minimum to the grinding tool 1020 through the filtered thickness signal $S_{THK2}$.

In some embodiments, a determination of whether the thickness extremum to be the thickness maximum or the thickness minimum may be done according to a selection of a target die among the dies of different types included in the reconstructed wafer 1040. For example, if an average thickness of the target die is larger than the average thickness of the dies of other types in the reconstructed wafer 1040, the thickness extremum is determined as the thickness maximum, and the thickness signal $S_{THK1}$ is filtered to output the thickness maximum among the thicknesses in the thickness signal $S_{THK1}$ generated within each time interval. Alternatively, if the average thickness of the target die is smaller than the average thickness of the dies of other types in the reconstructed wafer 1040, the thickness extremum is determined as the thickness maximum, and the thickness signal $S_{THK1}$ is filtered out to output the thickness minimum among the thicknesses in the thickness signal $S_{THK1}$ generated within each time interval.

In some embodiments, the endpoint detection system 1000 further includes an EPD software 1030 that may include a set of instructions and program codes for operating the grinding tool 1020 in different operating modes. The operating modes of the grinding tool 1020 may include a time mode, in which the grinding tool 1020 performs a grinding process until the endpoint is reached. The endpoint of the grinding process is determined according to the thickness extrema of the filtered thickness signal (e.g., $S_{THK2}$). In addition to the time mode, the EPD software 1030 may be used to operate the grinding tool 1020 in different operating modes such as average target mode.

In an alternative embodiment of the disclosure, the endpoint of the grinding process is determined according to the thickness signal corresponding to the target dies and a thickness difference between the dies of the first type and the dies of the second type. In some embodiments, if the thickness difference between the dies of the first type and the dies of the second type is within a proper range (e.g. 5 to 50 microns), the thickness difference is further considered to determine the endpoint of the grinding process. That is because, during the grinding process, the dies with smaller thickness will be ground out first, and if the thickness maximums are used to determine the endpoint of the grinding process, the thickness difference between the dies of two types may be used as a limit to the endpoint of the grinding process so as to ensure that the dies with smaller thickness will not be ground out. It is noted that, if the thickness difference is relatively small (e.g. less than 5 microns), the thickness difference may not be an issue for determining the endpoint and will not be considered. If the thickness difference is large (e.g. larger than 50 microns), instead of using the thickness maximums for determining the endpoint of the grinding process, the thickness minimums are used for determining the endpoint of the grinding process so as to increase the accuracy of grinding process.

Figure 2:
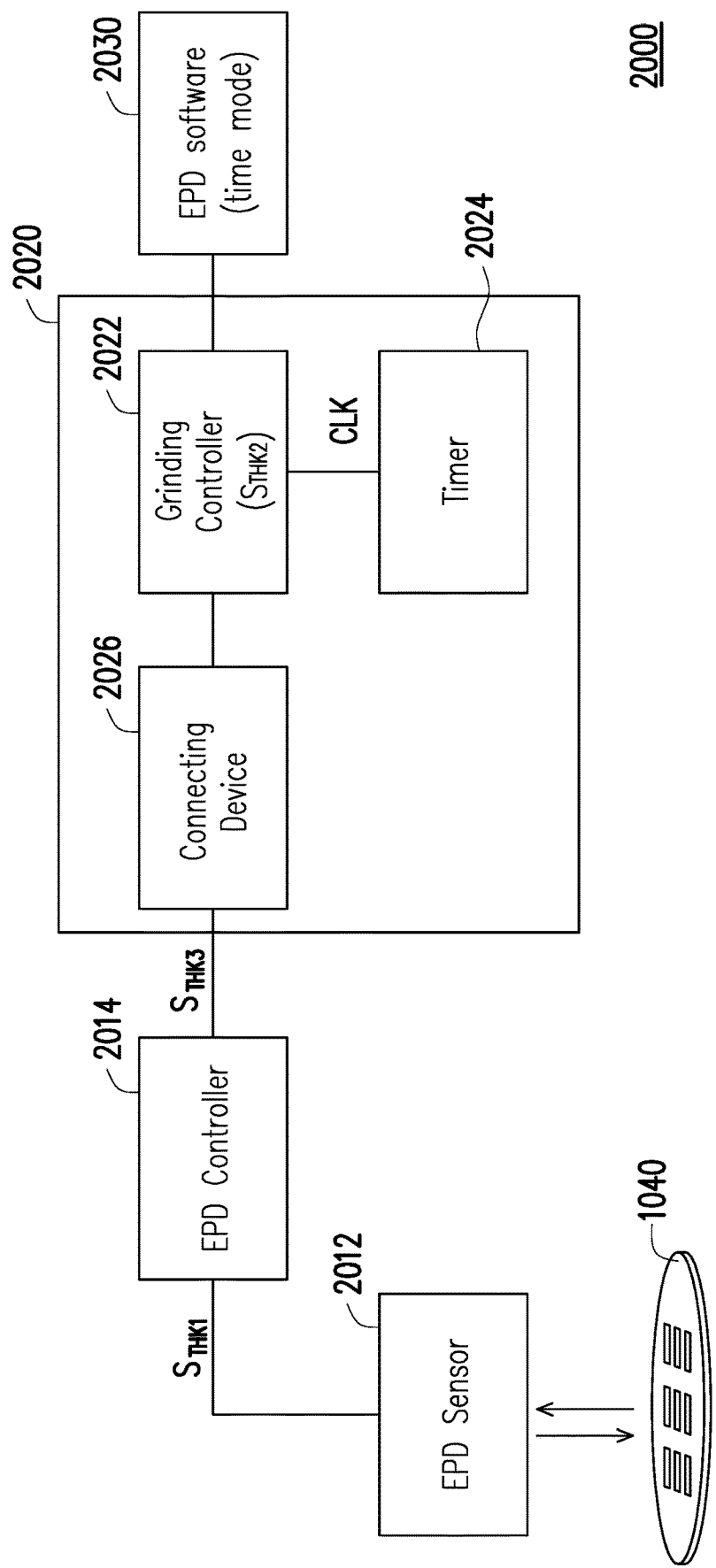
FIG. 2 illustrates a schematic block diagram of an endpoint detection system including an apparatus for detecting an endpoint of a grinding process according to another exemplary embodiment of the disclosure.

In some embodiments, FIG. 2 illustrates a schematic block diagram of an endpoint detection system including an apparatus for detecting an endpoint of a grinding process according to another exemplary embodiment of the disclosure. Referring to FIG. 2, an endpoint detection system 2000 of the present embodiment may include an EPD sensor

2012, an EPD controller 2014 and a grinding apparatus 2020. The EPD sensor 2012 is configured to sense a surface of the reconstructed wafer 1040 to output a thickness signal $S_{THK1}$. The EPD sensor 2012 in FIG. 2 is similar to the EPD sensor 1012 shown in FIG. 1H, thus detailed description about the EPD sensor 2012 is omitted hereafter.

In some embodiments, the EPD controller 2014 is coupled to the EPD sensor 2012, and is configured to control operations of the EPD sensor 2012. The EPD controller 2014 may receive the thickness signal $S_{THK1}$ generated by the EPD sensor 2012, and perform some pre-processing operations such as averaging or sampling on the thickness signal $S_{THK1}$ to generate a thickness signal $S_{THK3}$. Alternatively, the EPD controller 2014 may just forward the thickness signal $S_{THK1}$ as the thickness signal $S_{THK3}$ to the grinding apparatus 2020. In other words, the thickness signal $S_{THK3}$ may be the same or may be different from the thickness signal $S_{THK1}$.

The grinding apparatus 2020 includes a grinding controller 2022, a timer 2024 and a connecting device 2026. The connecting device 2026 is, for example, any wired or wireless interface compatible to the EPD controller 2014 such as USB, firewire, thunderbolt, universal asynchronous receiver/transmitter (UART), serial peripheral interface bus (SPI), WiFi, or Bluetooth, which is not limited herein. The connecting device 2026 is used to connect the grinding apparatus 2020 with the EPD controller 2014, such that the thickness signal $S_{THK3}$ is provided from the EPD controller 2014 to the grinding apparatus 2020 through the connecting device 2026.

The timer 2024 is configured to generate a clock signal CLK having a plurality of pulses with a time interval. The timer 2024 may have the similar function, structure, and operations to the timer 1016, thus the detailed description about the timer 2024 is omitted hereafter.

The grinding controller 2022 is coupled to the connecting device 2026 and the timer 2024 to receive the thickness signal $S_{THK3}$ through the connecting device 2026 and the clock signal CLK from the timer 2024. The grinding sensor 2022 is configured to filter the thickness signal $S_{THK3}$ according to the clock signal CLK to output a filtered thickness signal $S_{THK2}$. The filtered thickness signal $S_{THK2}$ is used to determine an endpoint of a grinding process. Particularly, the grinding sensor 2022 determines a thickness extremum among the thicknesses in the thickness signal $S_{THK3}$ within each time interval. The filtered thickness signal $S_{THK2}$ includes the thickness extrema determined in the time intervals.

In some embodiments, the thickness extremum may be a thickness maximum or a thickness minimum. When the thickness extremum is the thickness maximum, the grinding controller 2022 determine a thickness maximum among the thicknesses of the thickness signal $S_{THK}$ within each time interval to generate the filtered thickness signal $S_{THK2}$. Alternatively, when the thickness extremum is a thickness minimum, the grinding controller 2022 determine a thickness minimum among the thickness of the thickness signal $S_{THK3}$ within each time interval to generate the filtered thickness signal $S_{THK2}$.

In some embodiments, a target die among the dies of different types included in the reconstructed wafer 1040 may be used to determine whether the thickness maximum or the thickness minimum of the thickness signal $S_{THK3}$ is used to generate the filtered thickness signal $S_{THK2}$. In some embodiments, if an average thickness of the target die is larger than the average thickness of the dies of a specific type, the thickness extremum is the thickness maximum, and the filtered thickness signal $S_{THK2}$ is generated according to the thickness maximum among the thicknesses in the thickness signal $S_{THK3}$ generated within each time interval. Alternatively, if the average thickness of the target die is smaller than the average thickness of the dies of the specific type, the thickness extremum is the thickness minimum, and the filtered thickness signal $S_{THK2}$ is generated according to the thickness minimum among the thicknesses in the thickness signal $S_{THK3}$ generated within each time interval.

In some embodiments, the endpoint detection system 2000 further includes an EPD software 2030 that may include a set of instructions and program codes for operating the grinding apparatus 2020. The EPD software 2030 shown in FIG. 2 is similar to the EPD software 1030 shown in FIG. 1H, thus the detailed description about the EPD software 2030 in FIG. 2 is omitted hereafter.

In some embodiments, the apparatus for detecting an endpoint of a grinding process of the application includes all the elements in the endpoint detection systems as disclosed in FIG. 1H and FIG. 2, such as EPD controller, EPD sensor, timer, connecting device, grinding tool, and EPD software, which are not limited herein. That is, the apparatus for detecting an endpoint of a grinding process of the application may integrate functions of the detection apparatus 1010 in FIG. 1, the grinding apparatus 2020 in FIG. 2, and the EPD software.

Figure 3B:
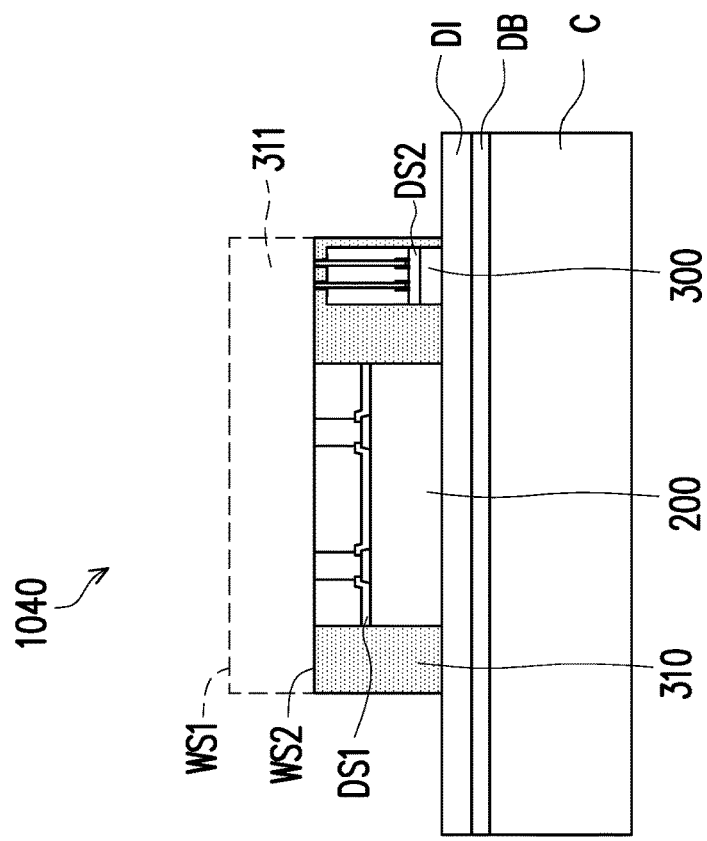
FIG. 3B illustrates a cross-sectional view of a reconstructed wafer portion including multiple dies during a grinding process according to an exemplary embodiment of the disclosure.
Figure 3A:
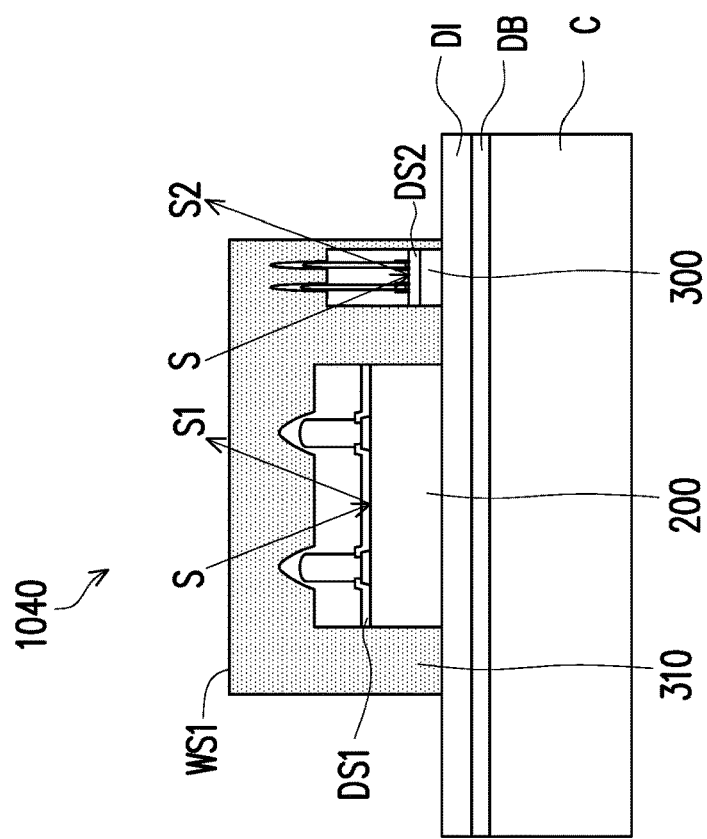
FIG. 3A illustrates a cross-sectional view of a reconstructed wafer portion including multiple dies before a grinding process according to an exemplary embodiment of the disclosure.

FIG. 3A illustrates a cross-sectional view of a reconstructed wafer portion including multiple dies before a grinding process according to an exemplary embodiment of the disclosure. FIG. 3B illustrates a cross-sectional view of a reconstructed wafer portion including multiple dies during a grinding process according to an exemplary embodiment of the disclosure. Referring to FIG. 3A, a portion of the reconstructed wafer 1040 includes a first die 200 as exemplified in FIG. 1G and a second die 300, and insulating layer 310. In some embodiments, the first die 200 and the second die 300 are one of a logic, a controller IC, a memory, an application processor, etc., and a type of the first die 200 is different from a type of the second die 300. The second die 300 may be fabricated through the process as illustrated in FIGS. 1A to 1G, which is not repeated herein. The insulating layer 310 is formed with insulating material that is filled in the space between the dies 200, 300 and covering the dies 200, 300.

Referring to FIG. 1H and FIG. 3A, in some embodiments, the EPD sensor 1012 may emit incident signal S to the reconstructed wafer 1040 and receive signals S1 and S2 reflected from the reconstructed wafer 1040 to generate the thickness signal $S_{THK1}$. The signal S1 is a reflected signal of the incident signal S on the interface DS1 of the first die 200, and the signal S2 is a reflected signal of the incident signal S on the interface DS2 of the second die 300. The incident signal S and the reflected signals S1 and S2 may be manipulated to calculate thicknesses from the surface WS1 of the insulating layer 310 to the interfaces of the first die 200 and the second die 300, respectively. Particularly, the incident signal S and the reflected signal S1 may be manipulated to calculate thicknesses from the surface WS1 of the insulating layer 310 to the interface DS1 of the first die 200, and the incident signal S and the reflected signal S2 may be manipulated to calculate thicknesses from the surface WS1 of the insulating layer 310 to the interface DS2 of the second die 300. The thickness signal $S_{THK1}$ may include thicknesses generated according to the incident signal S and the reflected signals S1 and S2. In some embodiments, the signals S, S1 and S2 are optical signals, but any other type of signal that is capable of detecting thickness may be applied in the embodiment.

Referring to FIG. 3A and FIG. 3B, in some embodiments, as a grinding process is performed on the reconstructed wafer 1040, a portion 311 of the insulating layer 310 is ground and a surface of the insulating layer 310 is changed from the surface WS1 to a surface WS2. The grinding process is ended according to an endpoint that is detected according to embodiment of the disclosure.

Figure 3C:
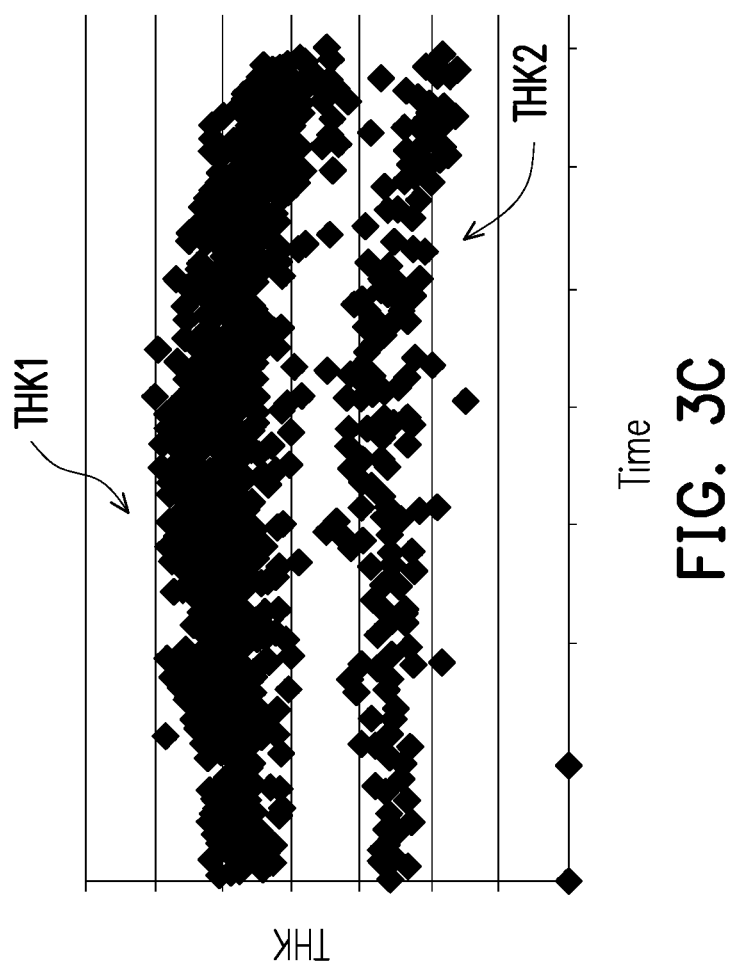
FIG. 3C illustrates an example of a thickness signal obtained by sensing a reconstructed wafer according to an exemplary embodiment of the disclosure.

Referring to FIG. 3A to FIG. 3C, an exemplary thickness signal that includes a plurality of thicknesses THK1 and a plurality of thicknesses THK2 are illustrated, wherein the x-axis represents Time (s) of measurement and the y-axis represents measured thickness THK (um). The thicknesses THK2 are the thicknesses measured from the surface WS1 of the insulating layer 310 to the interface DS1 of the first die 200; and the thicknesses THK1 are thicknesses measured from the surface WS1 of the insulating layer 310 to the interface DS2 of the second die 300. In some embodiments, the thickness signal is periodically sensed from the EPD sensor, and the thicknesses THK1 and THK2 are time-series data.

Figure 4:
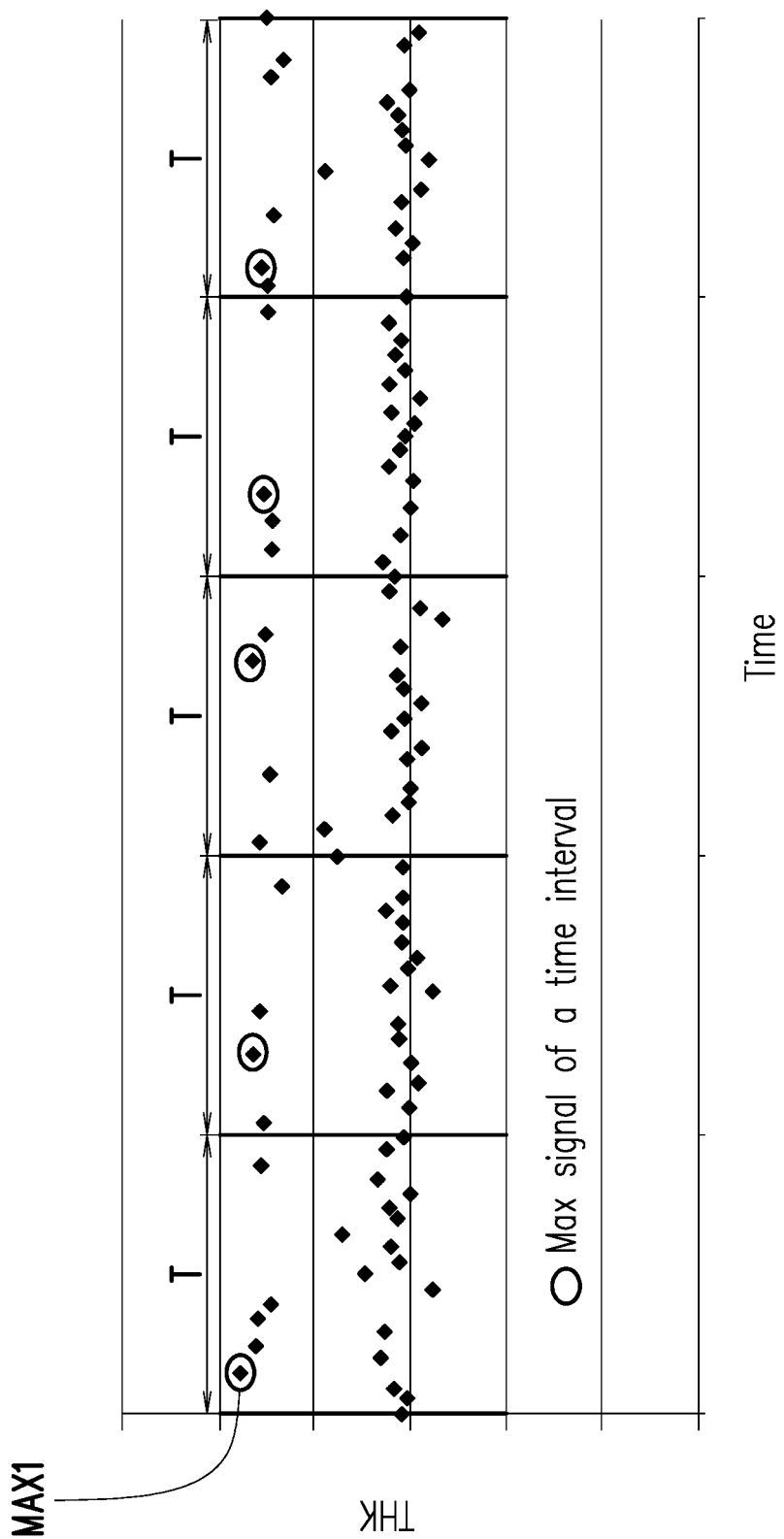
FIG. 4 illustrates time intervals and a thickness extremum in each of the time intervals according to an exemplary embodiment of the disclosure.

FIG. 4 illustrates time intervals and a thickness extremum in each of the time intervals according to an exemplary embodiment of the disclosure. Referring to FIG. 4, the x-axis represents Time (s) of measurement, the y-axis represents measured thickness THK (um), and a thickness signal including a plurality of measured thicknesses are separated by a plurality of time intervals T. The time interval T may be determined according to a clock signal provided by a timer. For example, the time interval T may be determined according to the clock signal CLK generated by the timer 1016 shown in FIG. 1H. Each of the thicknesses in the thickness signal represents a thickness from the surface of the insulating layer of the reconstructed wafer to the surface of the dies in the reconstructed wafer at a particular time point. Within each time interval T, a thickness extremum (e.g., thickness maximum or thickness minimum) among the thicknesses within the time interval T is determined. In the embodiment shown in FIG. 4, the thickness extremum is the thickness maximum Max1, but in another embodiment, the thickness extremum may be the thickness minimum. The thickness maximum Max1 within each of the time intervals T are combined to generate a filtered thickness signal that is used to detect an endpoint of a grinding process performed on the reconstructed wafer.

Figure 5A:
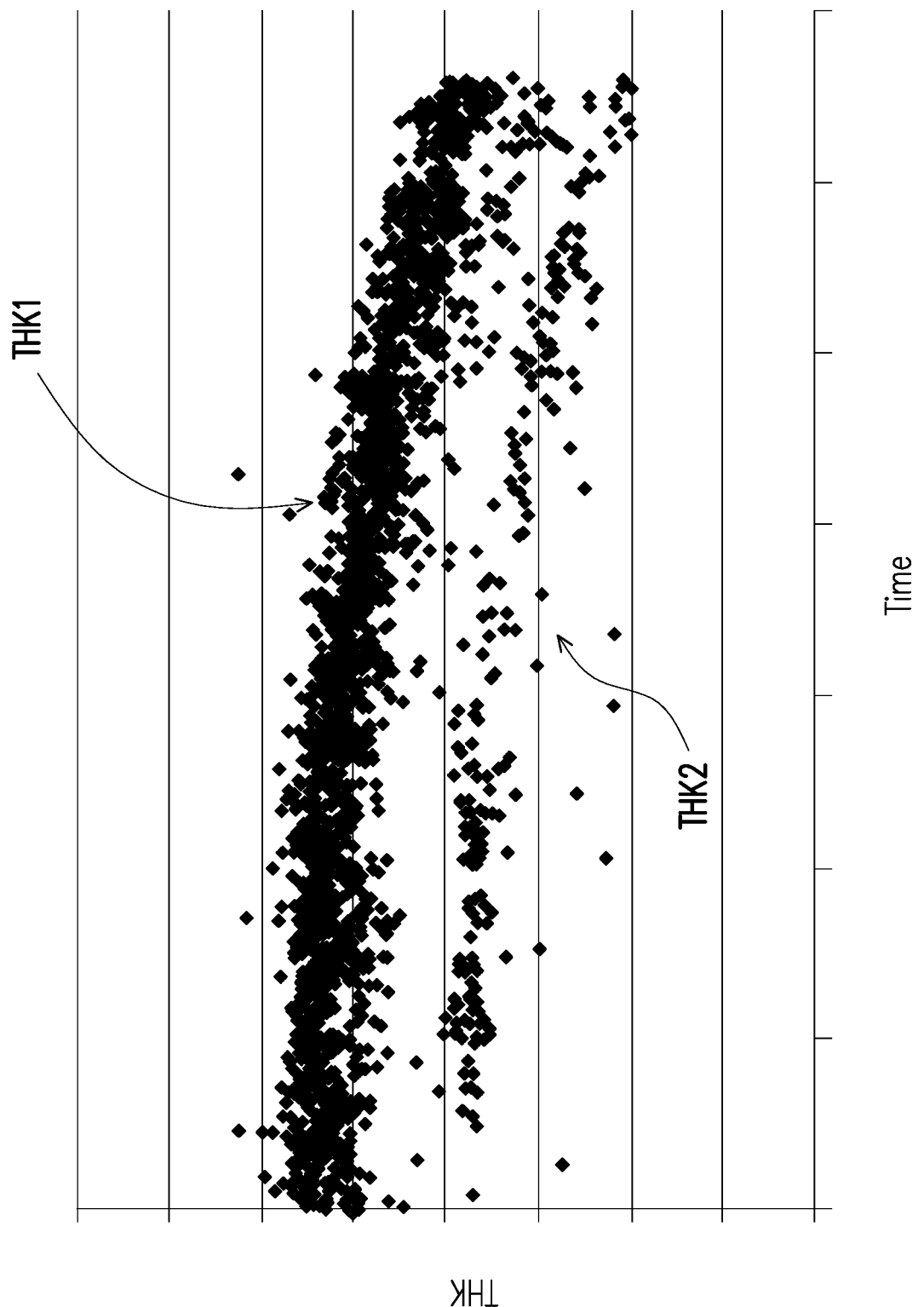
FIG. 5A to FIG. 5C illustrate thickness signals according to exemplary embodiments of the disclosure.
Figure 5B:
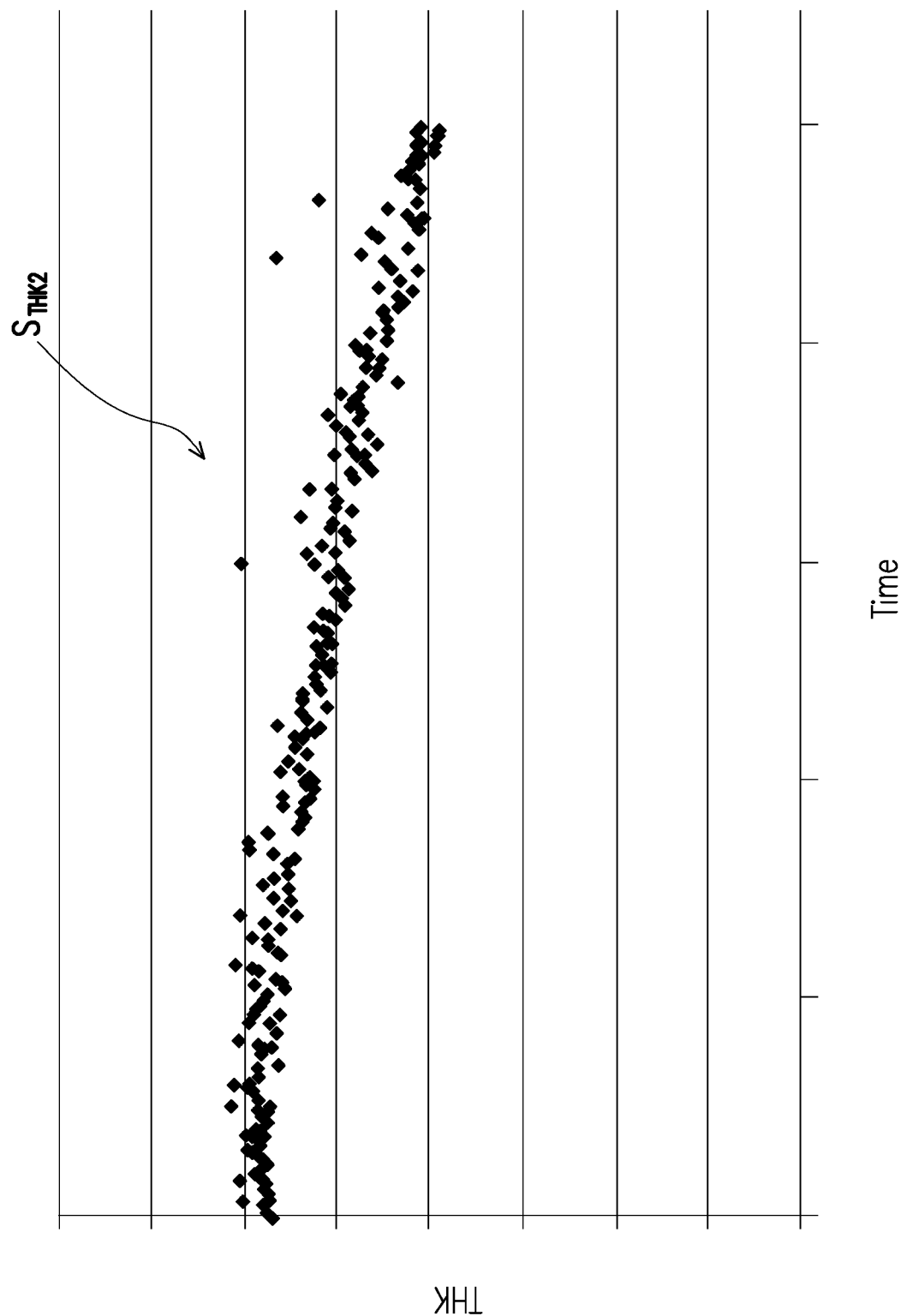
Figure 5C:
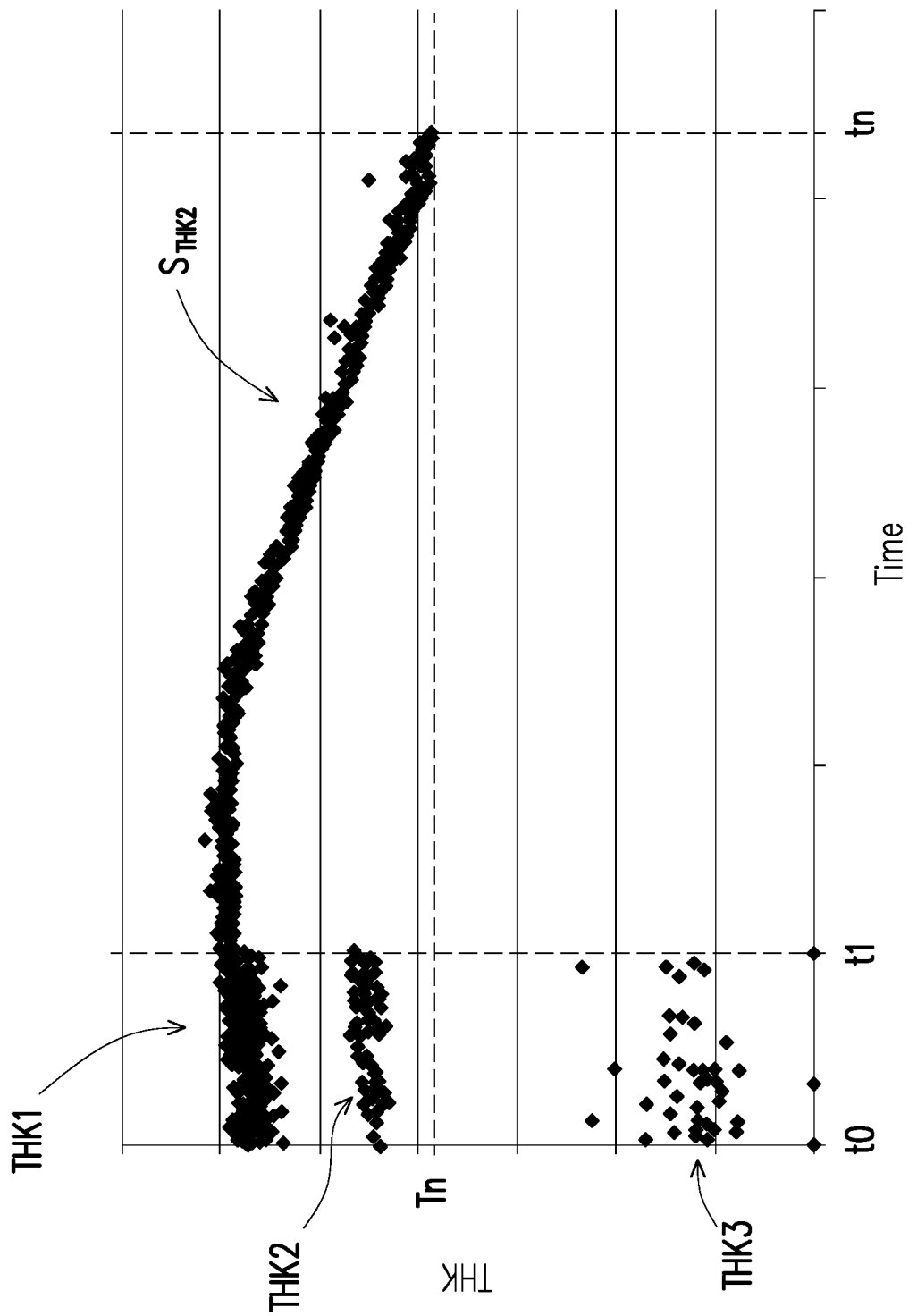

In some embodiments, FIG. 5A to FIG. 5C illustrate thickness signals according to some exemplary embodiments of the disclosure, wherein the x-axis represents Time (s) of measurement and the y-axis represents measured thickness THK (um). Referring to FIG. 5A, a thickness signal including a plurality of thicknesses THK1 and a plurality of thicknesses THK2 is illustrated. In some embodiments, the thicknesses THK1 represents thicknesses from a surface of the insulating layer of the reconstructed wafer to the interface of a first die, and the thicknesses THK1 represents thicknesses from a surface of the insulating layer of the reconstructed wafer to the interface of a second die. In some embodiments, the thickness signal shown in FIG. 5A is the thickness signal output by the EDP sensor. For example, the thickness signal shown in FIG. 5A may be the thickness signal $S_{THK1}$ output by the EPD sensor 1012 shown in FIG. 1H. Alternatively, the thickness signal shown in FIG. 5A may be the thickness signal $S_{THK1}$ output by the EPD sensor 2012 shown in FIG. 2.

Referring to FIG. 5B, a filtered thickness signal $S_{THK2}$ which includes thickness extrema of a thickness signal $S_{THK1}$ is illustrated. The filtered thickness signal $S_{THK2}$ may include thickness maxima of the thickness signal $S_{THK1}$, where each of the thickness maxima is a thickness maximum of the thickness signal $S_{THK1}$ within one of a plurality of time intervals. Alternatively, in some embodiments, the filtered thickness signal may include thickness minima of the thickness signal, where each of the thickness minima is a thickness minimum of the thickness signal within one of a plurality of time intervals. The filtered thickness signal $S_{THK2}$ is used to determine an endpoint of a grinding process.

FIG. 5C illustrates thickness signals according to an exemplary embodiment of the disclosure. Referring to FIG. 5C, thickness signal in different timings are illustrated. In the time period from t0 to t1, the thickness signal includes a plurality of thicknesses THK1, a plurality of thicknesses THK2 and plurality of thicknesses THK3. In some embodiments, the thicknesses THK1 are the thicknesses from the surface of the insulating layer of the reconstructed wafer to the interface of a first die, and the thicknesses THK2 are the thickness from the surface of the insulating layer of the reconstructed wafer to the interface of a second die. The thicknesses THK3 may be the thicknesses from the surface of the insulating layer of the reconstructed wafer to the interface of a third die, or may be the noises produced by the EPD sensor.

In the period from t1 to tn, the thickness signal generated by the EPD sensor is filtered to generate the filtered thickness signal $S_{THK2}$, where the filtered thickness signal $S_{THK2}$ includes a thickness extremum of the thickness signal within each time interval. In other words, the thickness extrema of the thickness signal in time intervals are determined and combined to generate the filtered thickness signal $S_{THK2}$. In the embodiments shown in FIG. 5C, the filtered thickness signal $S_{THK2}$ includes thickness maxima of the thickness signal within the time intervals. In an alternative embodiment, the filtered thickness signal $S_{THK2}$ includes thickness minima of the thickness signal within the time intervals.

The thicknesses of the filtered thickness signal $S_{THK2}$ are used to detect the endpoint of the grinding process. In some embodiments, the thicknesses of the filtered thickness signal $S_{THK2}$ are compared to a pre-determined thickness threshold Tn to determine the endpoint of the grinding process. When the thickness of the filtered thickness signal $S_{THK2}$ at the time point tn reaches the pre-determined thickness threshold Tn, the time point tn is determined as the endpoint of the grinding process.

In some embodiments, the time period from t0 to t1 illustrates the thickness signal in a first operating mode of endpoint detection system, and the time period from t1 to tn illustrates the thickness signal in a second operating mode of endpoint detection system. For example, the first operating mode may be an average target mode, and the second operating mode may be a time mode or a peak mode.

Figure 6:
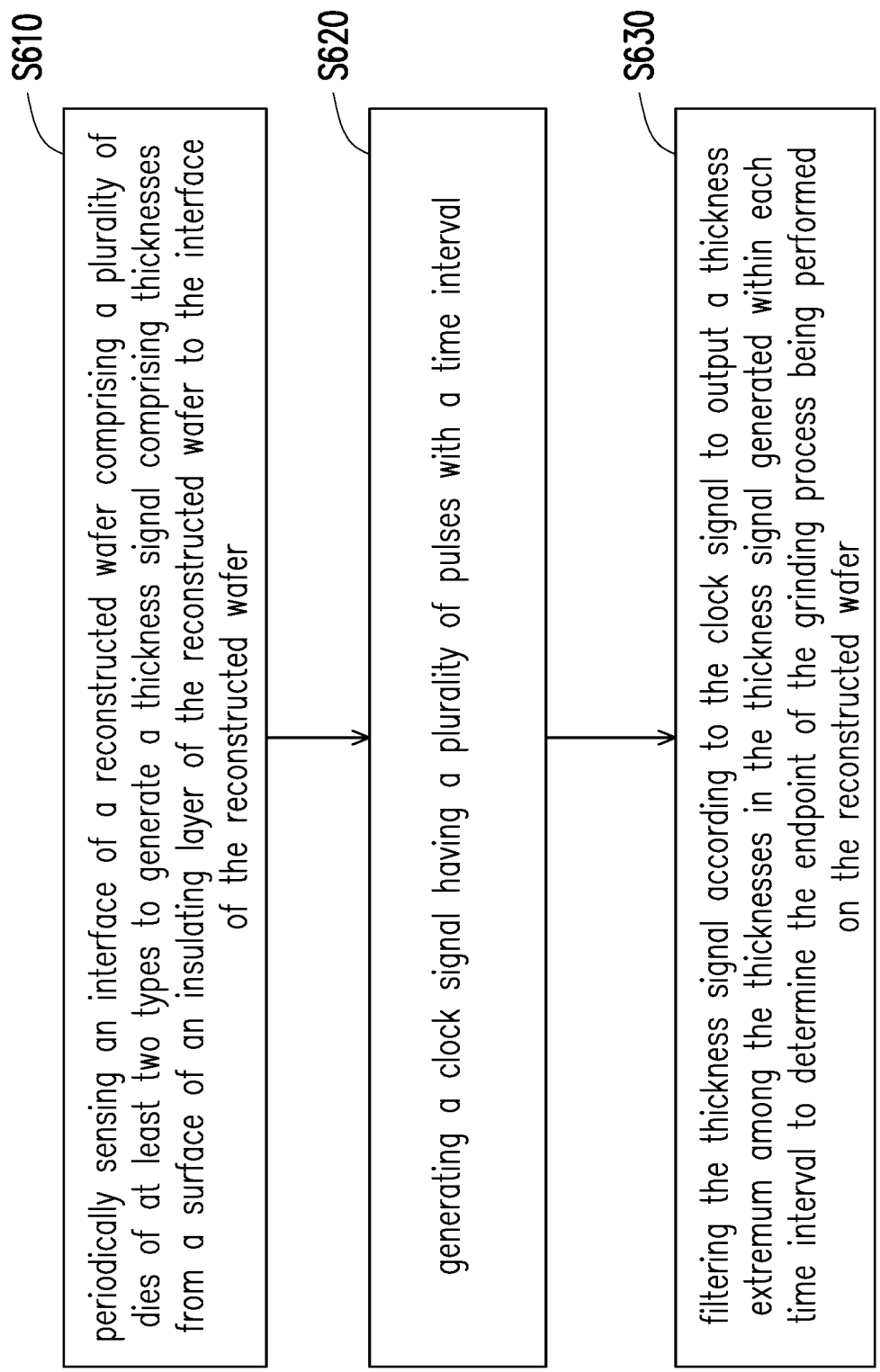
FIG. 6 illustrates a flowchart for detecting an endpoint of a grinding process according to an exemplary embodiment of the disclosure.

Referring to FIG. 6, an exemplary flowchart for detecting an endpoint of a grinding process is illustrated. In step S610, an interface of a reconstructed wafer is periodically sensed, where the reconstructed wafer includes a plurality of dies of at least two types, to generate a thickness signal comprising thicknesses from a surface of an insulating layer of the reconstructed wafer to the interface of the reconstructed wafer. In step S620, a clock signal having a plurality of pulses with a time interval is generated. In step S630, the thickness signal is filtered according to the clock signal to output a thickness extremum among the thicknesses in the thickness signal generated within each time interval to determine the endpoint of the grinding process being performed on the reconstructed wafer.

Figure 7:
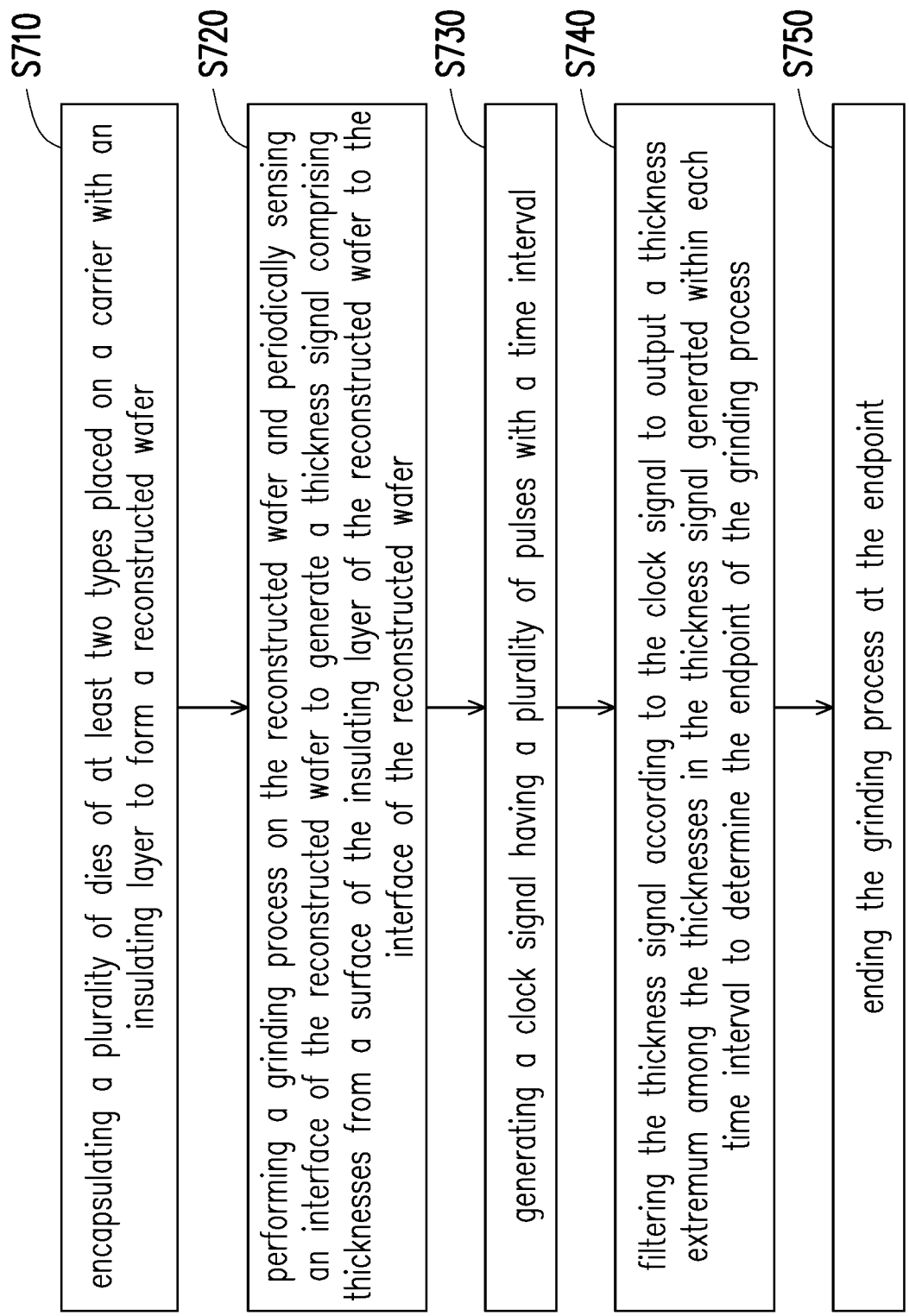
FIG. 7 illustrates a flowchart diagram of a method for manufacturing a semiconductor structure according to an exemplary embodiment of the disclosure.

Referring to FIG. 7, a method for manufacturing a semiconductor structure according to an exemplary embodiment of the disclosure is illustrated. In step S710, a plurality of dies of at least two types placed on a carrier are encapsulated with an insulating layer to form a reconstructed wafer. In step S720, a grinding process is performed on the reconstructed wafer and an interface of the reconstructed wafer is periodically sensed to generate a thickness signal comprising thicknesses from a surface of the insulating layer of the reconstructed wafer to the interface of the reconstructed wafer. In step S730, a clock signal having a plurality of pulses with a time interval is generated. In step S740, the thickness signal is filtered according to the clock signal to output a thickness extremum among the thicknesses in the thickness signal generated within each time interval to determine the endpoint of the grinding process. In step S750, the grinding process is ended at the endpoint. In some embodiments, the method further includes a step of de-bonding the dies of the reconstructed wafer from the carrier to form a semiconductor structure.

According to some embodiments of the disclosure, an apparatus for detecting an endpoint of a grinding process includes a connecting device, a timer and a controller. The connecting device is configured to connect with a sensor that periodically senses an interface of a reconstructed wafer comprising a plurality of dies of at least two types to generate a thickness signal comprising thicknesses from a surface of an insulating layer of the reconstructed wafer to the interface of the reconstructed wafer sensed by the sensor. The timer is configured to generate a clock signal having a plurality of pulses with a time interval. The controller is coupled to the sensor and the timer, and is configured to filter the thickness signal according to the clock signal to output a thickness extremum among the thicknesses in the thickness signal generated within each time interval, and wherein the thickness signal after the filtering is used to determine the endpoint of the grinding process being performed on the reconstructed wafer.

According to some embodiments of the disclosure, a method of detecting an endpoint of a grinding process includes steps of periodically sensing an interface of a reconstructed wafer comprising a plurality of dies of at least two types to generate a thickness signal comprising thicknesses from a surface of an insulating layer of the reconstructed wafer to the interface of the reconstructed wafer; generating a clock signal having a plurality of pulses with a time interval; and filtering the thickness signal according to the clock signal to output a thickness extremum among the thicknesses in the thickness signal generated within each time interval to determine the endpoint of the grinding process being performed on the reconstructed wafer.

According to some embodiments of the disclosure, a method includes steps of encapsulating a plurality of dies of at least two types placed on a carrier with an insulating layer to form a reconstructed wafer; performing a grinding process on the reconstructed wafer and periodically sensing an interface of the reconstructed wafer to generate a thickness signal comprising thicknesses from a surface of the insulating layer of the reconstructed wafer to the interface of the reconstructed wafer; generating a clock signal having a plurality of pulses with a time interval; filtering the thickness signal according to the clock signal to output a thickness extremum among the thicknesses in the thickness signal generated within each time interval to determine the endpoint of the grinding process; and ending the grinding process at the endpoint.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of detecting an endpoint of a grinding process, comprising:
periodically sensing an interface of a reconstructed wafer formed by encapsulating a plurality of dies of at least two types placed on a carrier with an insulating layer to calculate a plurality of thicknesses from a surface of an insulating layer of the reconstructed wafer to the interface of the reconstructed wafer and generating a thickness signal comprising the thicknesses, wherein the thicknesses in the thickness signal comprise thicknesses from the surface of the insulating layer to interfaces of the dies of a first type and thicknesses from the surface of the insulating layer to interfaces of the dies of a second type;
generating a clock signal having a plurality of pulses with a time interval smaller than a time length of the thickness signal; and
filtering the thickness signal according to the clock signal to output a thickness maximum or a thickness minimum among the thicknesses in the thickness signal generated within each time interval according to an average thickness of a target die among the dies of the first type and the second type to determine the endpoint of the grinding process being performed on the reconstructed wafer.

2. The method of claim 1, wherein the thickness signal is generated according to an optical signal scattered from the interface of the reconstructed wafer.

3. The method of claim 1, wherein filtering the thickness signal to output the thickness maximum or the thickness minimum among the thicknesses in the thickness signal generated within each time interval comprises:
filtering the thickness signal to output the thickness maximum among the thicknesses in the thickness signal generated within each time interval if the average thickness of the target die of one type of the first type and the second type is larger than an average thickness of the dies of an other type of the first type and the second type; and
filtering the thickness signal to output the thickness minimum among the thicknesses in the thickness signal generated within each time interval if the average thickness of the target die of the one type is smaller than the average thickness of the dies of the other type.

4. The method of claim 3, wherein the thickness signal corresponding to the target dies is used to determine the endpoint of the grinding process.

5. The method of claim 3, wherein the thickness signal corresponding to the target dies and a thickness difference between the dies of the first type and the dies of the second type is used to determine the endpoint of the grinding process.

6. The method of claim 5, wherein the thickness difference between the dies of the first type and the dies of the second type is used to determine the endpoint of the grinding process if the thickness difference is determined to be within 5 to 50 microns.

7. A method, comprising:
encapsulating a plurality of dies of at least two types placed on a carrier with an insulating layer to form a reconstructed wafer;
performing a grinding process on the reconstructed wafer and periodically sensing an interface of the reconstructed wafer to calculate a plurality of thicknesses from a surface of the insulating layer of the reconstructed wafer to the interface of the reconstructed wafer and generating a thickness signal comprising the thicknesses, wherein the thicknesses in the thickness signal comprise thicknesses from the surface of the insulating layer to interfaces of the dies of a first type and thicknesses from the surface of the insulating layer to interfaces of the dies of a second type;
generating a clock signal having a plurality of pulses with a time interval smaller than a time length of the thickness signal;
filtering the thickness signal according to the clock signal to output a thickness maximum or a thickness minimum among the thicknesses in the thickness signal generated within each time interval according to an average thickness of a target die among the dies of the first type and the second type to determine the endpoint of the grinding process; and
ending the grinding process at the endpoint.

8. The method of claim 7, further comprising:
de-bonding the dies of the reconstructed wafer from the carrier to form a semiconductor structure.

9. The method of claim 1, further comprising:
performing the grinding process on the reconstructed wafer and determining the endpoint of the grinding process when the thicknesses in the thickness signal after the filtering reach a target thickness.

10. The method of claim 1, further comprising:
feeding the thickness signal after the filtering to a grinding apparatus of the reconstructed wafer to determine the endpoint of the grinding process being performed on the reconstructed wafer.

11. The method of claim 7, wherein the thickness signal is generated according to an optical signal scattered from the interface of the reconstructed wafer.

12. The method of claim 7, wherein filtering the thickness signal to output the thickness maximum or the thickness minimum among the thicknesses in the thickness signal generated within each time interval comprises:
filtering the thickness signal to output the thickness maximum among the thicknesses in the thickness signal generated within each time interval if the average thickness of the target die of one type of the first type and the second type is larger than an average thickness of the dies of an other type of the first type and the second type; and
filtering the thickness signal to output the thickness minimum among the thicknesses in the thickness signal generated within each time interval if the average thickness of the target die of the one type is smaller than the average thickness of the dies of the other type.

13. The method of claim 12, wherein the thickness signal corresponding to the target dies is used to determine the endpoint of the grinding process.

14. The method of claim 12, wherein the thickness signal corresponding to the target dies and a thickness difference between the dies of the first type and the dies of the second type is used to determine the endpoint of the grinding process.

15. The method of claim 14, wherein the thickness difference between the dies of the first type and the dies of the second type is used to determine the endpoint of the grinding process if the thickness difference is determined to be within 5 to 50 microns.

16. A method, comprising:
encapsulating a plurality of dies of at least two types placed on a carrier with an insulating layer to form a reconstructed wafer;
controlling a grinding apparatus to perform a grinding process on the reconstructed wafer and periodically sensing an interface of the reconstructed wafer to calculate a plurality of thicknesses from a surface of the insulating layer of the reconstructed wafer to the interface of the reconstructed wafer and generating a thickness signal comprising the thicknesses, wherein the thicknesses in the thickness signal comprise thicknesses from the surface of the insulating layer to interfaces of the dies of a first type and thicknesses from the surface of the insulating layer to interfaces of the dies of a second type;
generating a clock signal having a plurality of pulses with a time interval smaller than a time length of the thickness signal;
filtering the thickness signal according to the clock signal to output a thickness maximum or a thickness minimum among the thicknesses in the thickness signal generated within each time interval according to an average thickness of a target die among the dies of the first type and the second type to determine the endpoint of the grinding process; and
feeding the thickness signal after the filtering to the grinding apparatus of the reconstructed wafer to determine the endpoint of the grinding process being performed on the reconstructed wafer.

17. The method of claim 16, wherein the thickness signal is generated according to an optical signal scattered from the interface of the reconstructed wafer.

18. The method of claim 16, wherein filtering the thickness signal to output the thickness maximum or the thickness minimum among the thicknesses in the thickness signal generated within each time interval comprises:
filtering the thickness signal to output the thickness maximum among the thicknesses in the thickness signal generated within each time interval if the average thickness of the target die of one type of the first type and the second type is larger than an average thickness of the dies of an other type of the first type and the second type; and
filtering the thickness signal to output the thickness minimum among the thicknesses in the thickness signal generated within each time interval if the average thickness of the target die of the one type is smaller than the average thickness of the dies of the other type.

19. The method of claim 16, wherein the thickness signal corresponding to the target dies is used to determine the endpoint of the grinding process.

20. The method of claim 16, wherein the thickness signal corresponding to the target dies and a thickness difference between the dies of the first type and the dies of the second type is used to determine the endpoint of the grinding process.

\* \* \* \* \*